(12) United States Patent
Lin et al.

(10) Patent No.: US 8,232,192 B2
(45) Date of Patent: Jul. 31, 2012

(54) PROCESS OF BONDING CIRCUITRY COMPONENTS

(75) Inventors: Mou-Shiung Lin, Hsin-Chu (TW); Shih Hsiung Lin, Hsinchu (TW); Hsin-Jung Lo, Yonghe (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 11/124,493

(22) Filed: May 5, 2005

(65) Prior Publication Data

US 2005/0266670 A1 Dec. 1, 2005

(30) Foreign Application Priority Data

May 5, 2004 (TW) ................................ 93112610 A

(51) Int. Cl.
*H01L 21/44* (2006.01)

(52) U.S. Cl. . 438/612; 438/613; 257/778; 257/E21.122; 257/E21.503

(58) Field of Classification Search .................. 438/116, 438/118, 612–613, 615–616, 406, 455, 618, 438/108, 597; 257/E21.122, 737, E23.021, 257/778, E21.503
See application file for complete search history.

(56) References Cited

U.S. PATENT DOCUMENTS

| | | | |
|---|---|---|---|
| 5,134,460 A | 7/1992 | Brady et al. | |
| 5,226,232 A | 7/1993 | Boyd | |
| 5,384,952 A * | 1/1995 | Matsui | ............................ 29/840 |
| 5,631,499 A | 5/1997 | Hosomi et al. | |
| 5,641,990 A | 6/1997 | Chiu | |
| 5,883,435 A | 3/1999 | Geffken et al. | |
| 6,013,571 A | 1/2000 | Morrell | |
| 6,077,726 A | 6/2000 | Mistry et al. | |
| 6,144,100 A | 11/2000 | Shen et al. | |
| 6,187,680 B1 | 2/2001 | Costrini et al. | |
| 6,214,716 B1 * | 4/2001 | Akram | .......................... 438/612 |
| 6,229,711 B1 | 5/2001 | Yoneda | |
| 6,362,090 B1 * | 3/2002 | Paik et al. | ..................... 438/614 |
| 6,365,441 B1 | 4/2002 | Raiser | |
| 6,404,064 B1 | 6/2002 | Tsai | |
| 6,407,459 B2 * | 6/2002 | Kwon et al. | .................. 257/780 |
| 6,426,281 B1 | 7/2002 | Lin et al. | |
| 6,465,877 B1 | 10/2002 | Farnworth | |

(Continued)

FOREIGN PATENT DOCUMENTS

EP 1387402 2/2004

(Continued)

OTHER PUBLICATIONS

Ezaki, Takayuki et al. "A 160Gb/s Interface Design Configuration for Multichip LSI,"IEEE International Solid-State Circuits Conference 2004, Session 7, T: Scaling Trends, 7.5. Jun. 2004, 8 pages.

(Continued)

*Primary Examiner* — Khiem D Nguyen
(74) *Attorney, Agent, or Firm* — McDermott Will & Emery LLP

(57) ABSTRACT

A bonding process includes the following process. A bump is formed on a first electric device. A patterned insulation layer is formed on a second electric device, wherein the patterned insulation layer has a thickness between 5 μm and 400 μm, and an opening is in the patterned insulation layer and exposes the second electric device. The bump is joined to the second electric device exposed by the opening in the patterned insulation layer.

67 Claims, 6 Drawing Sheets

U.S. PATENT DOCUMENTS

| | | | |
|---|---|---|---|
| 6,469,908 B2 | 10/2002 | Patel | |
| 6,479,900 B1 | 11/2002 | Shinogi et al. | |
| 6,599,775 B2 | 7/2003 | Tie | |
| 6,642,079 B1* | 11/2003 | Liu et al. | 438/108 |
| 6,660,565 B1 | 12/2003 | Briar | |
| 6,667,230 B2 | 12/2003 | Chen | |
| 6,683,380 B2 | 1/2004 | Efland et al. | |
| 6,700,209 B1 | 3/2004 | Raiser | |
| 6,707,159 B1 | 3/2004 | Kumamoto et al. | |
| 6,713,318 B2 | 3/2004 | Maeda | |
| 6,762,122 B2 | 7/2004 | Mis et al. | |
| 6,774,497 B1* | 8/2004 | Qi et al. | 257/783 |
| 6,809,020 B2 | 10/2004 | Sakurai et al. | |
| 6,821,878 B2* | 11/2004 | Danvir et al. | 438/613 |
| 6,853,076 B2 | 2/2005 | Datta et al. | |
| 6,940,169 B2 | 9/2005 | Jin et al. | |
| 7,029,949 B2* | 4/2006 | Farnworth et al. | 438/113 |
| 7,220,657 B2 | 5/2007 | Ihara et al. | |
| 2001/0040290 A1 | 11/2001 | Sakurai et al. | |
| 2002/0002880 A1 | 1/2002 | Pavlicevic et al. | 75/381 |
| 2002/0043723 A1 | 4/2002 | Shimizu et al. | |
| 2002/0109228 A1* | 8/2002 | Buchwalter et al. | 257/738 |
| 2002/0196996 A1* | 12/2002 | Ray et al. | 385/14 |
| 2003/0006062 A1 | 1/2003 | Stone et al. | |
| 2003/0127734 A1 | 7/2003 | Lee et al. | 257/737 |
| 2003/0129822 A1 | 7/2003 | Lee et al. | 438/613 |
| 2003/0137039 A1* | 7/2003 | Nakano et al. | 257/680 |
| 2003/0218246 A1 | 11/2003 | Abe et al. | |
| 2003/0234276 A1* | 12/2003 | Tsai et al. | 228/180.22 |
| 2004/0007779 A1 | 1/2004 | Arbuthnot et al. | |
| 2004/0032024 A1 | 2/2004 | Lee et al. | 257/734 |
| 2004/0121267 A1* | 6/2004 | Jang | 430/315 |
| 2004/0238955 A1* | 12/2004 | Homma et al. | 257/737 |
| 2005/0026413 A1 | 2/2005 | Lee et al. | 438/612 |

FOREIGN PATENT DOCUMENTS

| | | |
|---|---|---|
| EP | 1536469 | 6/2005 |
| TW | 452949 | 9/2001 |
| TW | 471148 | 1/2002 |
| TW | 557519 | 10/2003 |
| TW | 561563 | 11/2003 |
| TW | 567598 | 12/2003 |
| TW | 200307356 | 12/2003 |
| TW | 572349 | 1/2004 |
| TW | 572361 | 1/2004 |
| TW | 578226 | 3/2004 |
| TW | 578288 | 3/2004 |
| TW | 580194 | 3/2004 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technology Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection,"IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

PROCESS OF BONDING CIRCUITRY COMPONENTS

CROSS-REFERENCE TO RELATED APPLICATION

This application claims the priority benefit of Taiwan application serial no. 93112610, filed on May 5, 2004. All disclosure of the Taiwan application is incorporated herein by reference.

BACKGROUND OF THE INVENTION

1. Field of the Invention

The invention relates to a chip bonding process, and more particularly to a process for a patterned underfill being formed in advance of bonding chips.

2. Description of the Related Art

IT products are playing a more and more important role in modern industrial society recently. The function of electronic products becomes much more versatile as the trend renews old-fashion IT products. Their qualities are becoming more stable as well. When it comes to package technology, in order to possess better performance in electric conduction and thermal conduction, Flip Chip Package is the common option and it occupies less package volume.

Referring to FIG. 1 and FIG. 2, cross-sectional views showing a chip-on-chip package using a conventional flip-chip technology, chips 110 and 220 are first bonded by bumps 130 and then it undergoes the process of filling underfill 140 into the gap between the chips 110 and 120, in which a less-viscous polymer fluid is first applied onto the chip 120 adjacent to the chip 110 and then this less-viscous polymer fluid inflows the gap between the chips 110 and 120 via capillary action.

However, using less viscous polymer fluid as the underfill 140 will cause the following drawbacks.

1. When the less viscous underfill 140 is filled into the gap between the chips 110 and 120, it further spreads outside the surrounding area of chip 110. Therefore, part of the underfill 140 after cured is left outside the surrounding area of chip 110. The underfill 140 flows even further onto another chip pad 122 for being subsequently wirebonded thereto due to the underfill 140 having less viscosity and higher fluidity, as shown in FIG. 1.

2. In order to prevent the underfill 140 from polluting the chip pad 122 adjacent to the chip 110, it is necessary to relocate chip pad 122 far away from the chip 110. This will introduce a great deal of limitation to the design for relocating the chip pad 122 of the chip 120.

3. It is very inefficient by this way to fill the underfill 140 into the gap between the chips 110 and 120 when multiple of the chips 110 need to be bonded with multiple of the chips 120 on a wafer. Because it takes many steps to fill the underfill 140 into the gaps between each of the chips 110 and each of the chips 120 on a wafer. As a result, low productivity can be expected.

SUMMARY OF THE INVENTION

Therefore, one objective of the present invention is to provide a chip bonding process. The underfill contaminating the pads of the lower wafer adjacent to the underfill can be avoided. It is not necessary to change the layout of the pads of the lower wafer for avoiding the underfill contaminating the pads of the lower wafer.

Therefore, another objective of the present invention is to provide a chip bonding process capable of enhancing the productivity.

In order to reach the above objectives, the present invention provides a bonding process comprising forming a bump on a first electric device; forming a patterned insulation layer on a second electric device, wherein said patterned insulation layer has a thickness between 5 μm and 400 μm, and an opening is in said patterned insulation layer and exposes said second electric device; and joining said bump and said second electric device exposed by said opening in said patterned insulation layer.

Both the foregoing general description and the following detailed description are exemplary and explanatory only and are not restrictive to the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated as a part of this specification. The drawings illustrate embodiments of the invention and, together with the description, serve to explain the principles of the invention.

DESCRIPTION OF THE PREFERRED EMBODIMENTS

First Embodiment

Figure 1:
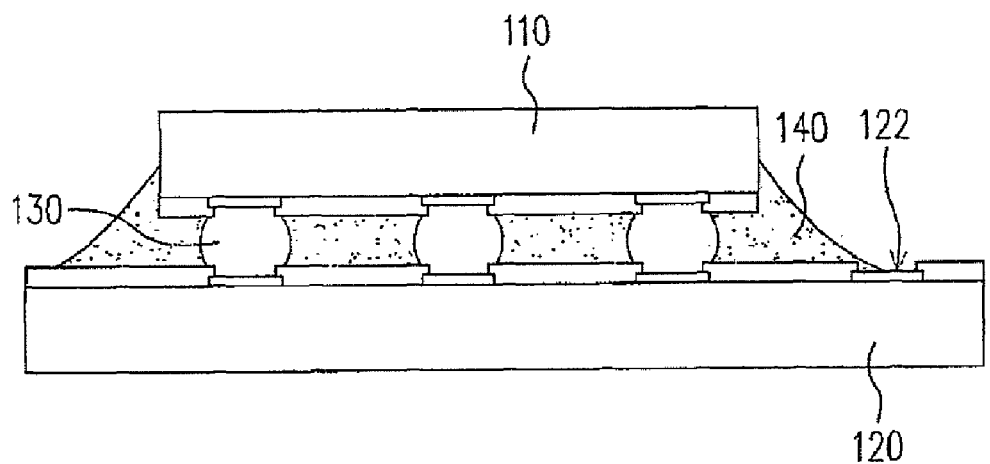
FIGS. 1 and 2 are cross-sectional views showing a chip-on-chip package using a conventional flip-chip technology.
Figure 2:
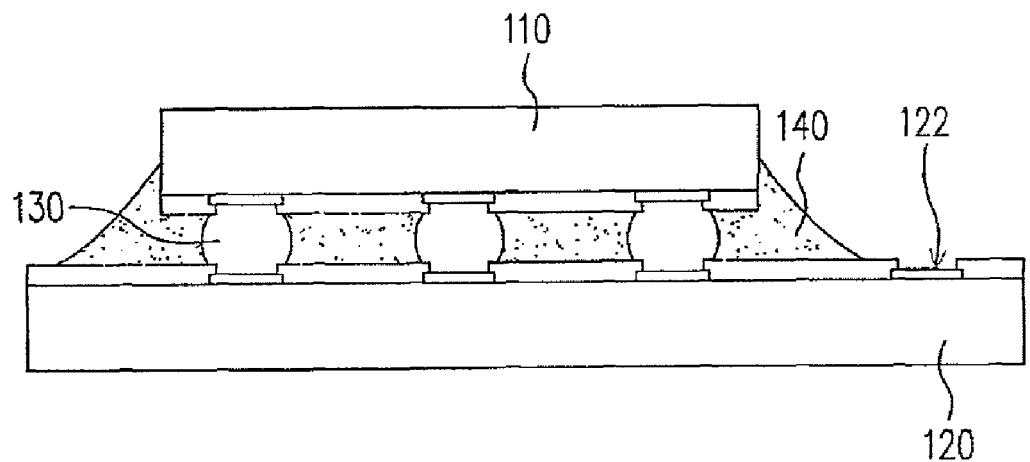
Figure 3:
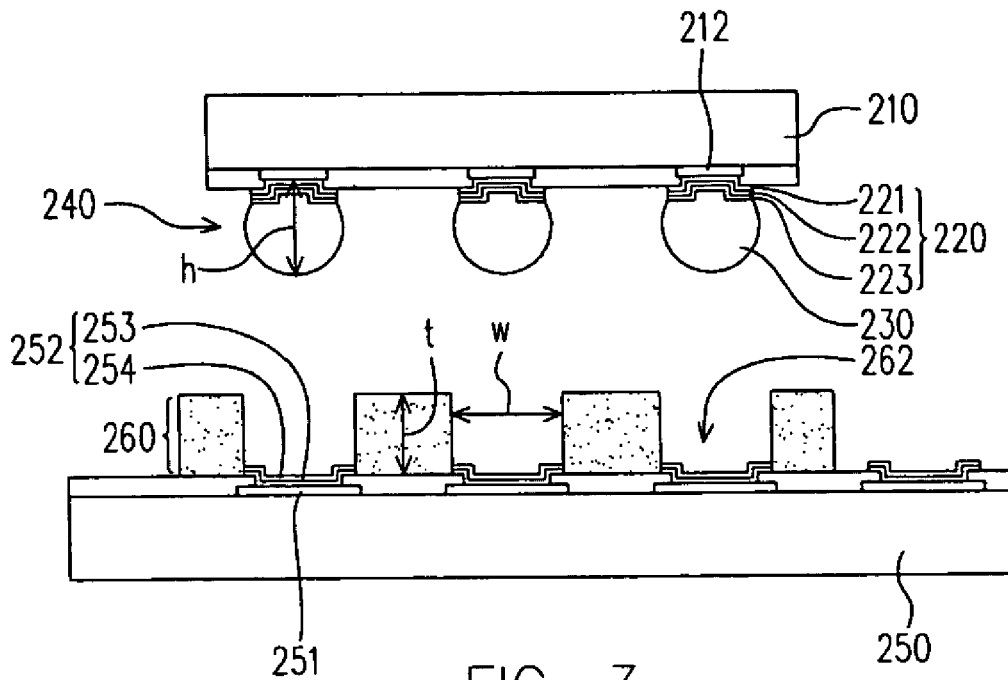
FIGS. 3-5 are cross-sectional views showing a chip bonding process according to a first preferred embodiment.
Figure 4:
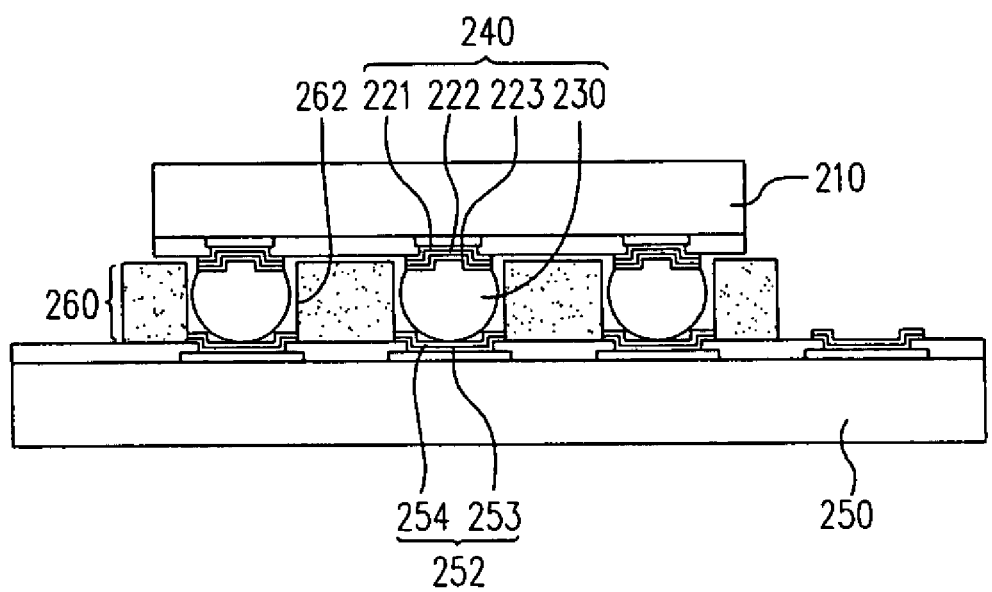
Figure 5:
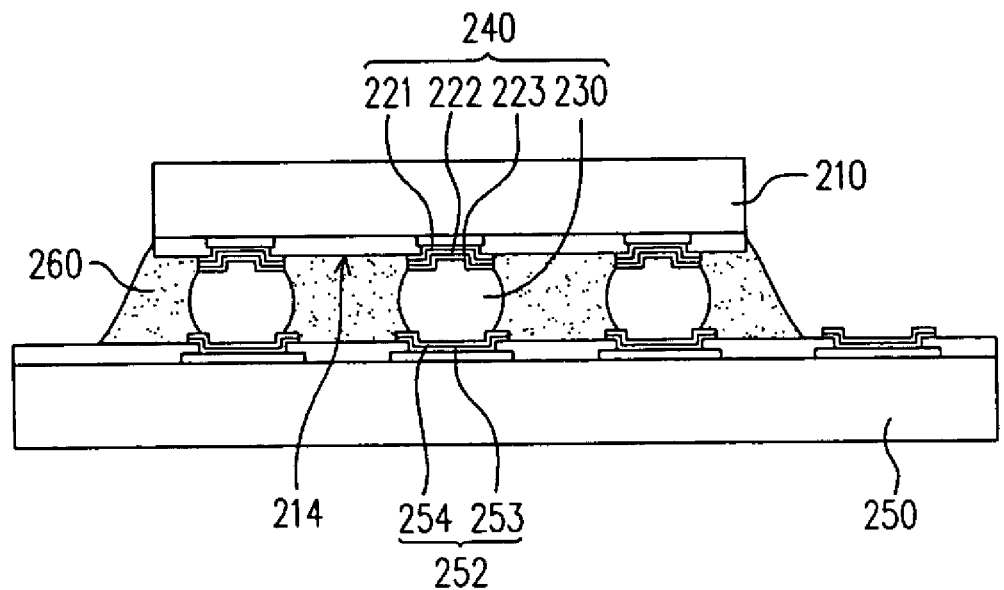

Referring to FIGS. 3-5, cross-sectional views showing a chip bonding process according to a first preferred embodiment, multiple chips 210 (only one shown in FIGS. 3-5) are provided with a number of aluminium or copper pads 212. The chip 210 comprises a semiconductor substrate with multiple active devices, such as transistor or CMOS, and an interconnecting metallization layer formed on the semiconductor substrate. The pads 212 are connected to the interconnecting metallization layer. Multiple bumps 240 are respectively formed on the pads 212 of the chip 210. The bumps 240 are deposited, for example, by forming a UBM (Under Bump Metallurgy) layer 220 on the pads 212 of the chip 210, followed by forming a solder material 230 on the UBM layer 220 and then performing a reflowing process which makes the solder material 230 ball-shaped, wherein the height h of the bumps 240 ranges from about 5 μm to 400 μm.

The UBM layer 220 is deposited, for example, by sputtering an adhesion/barrier layer 221 on the pads 212 of the chip 210, electroplating or sputtering a copper layer 222 on the adhesion/barrier layer 221 and then electroplating or sputtering a nickel layer 223 on the copper layer 222. The adhesion/barrier layer 221 comprises one layer of Ti, TiN or titanium-tungsten alloy, or comprises multiple layers stacked by a Cr layer and a Cu—Cr-alloy layer, the Cu—Cr-alloy layer formed on the Cr layer. Therefore, The Solder material 230 can be formed on the Ni layer 223 of the UBM layer. The solder material 230 could be, for example, SnPb alloy, Sn—Ag alloy, Sn—Ag—Cu alloy or other lead-free solder material. Alternatively, a seed layer (not shown) comprising copper can be formed on the adhesion/barrier layer 221 using a sputter process and then the copper layer 222 is electroplated on the seed layer, the nickel 223 electroplated on the copper layer 222.

A wafer 250 is provided with multiple pads 252. The wafer 250 comprises a semiconductor substrate with multiple active devices, such as transistor or CMOS, and an interconnecting metallization layer formed on the semiconductor substrate. Multiple original aluminium or copper pads 251 are connected to the interconnecting metallization layer. The pads 252 including an adhesion/barrier layer 253 and an upper metal layer 254 which lies on the adhesion/barrier layer 253 are formed on the original pads 251. The bumps 240 are suitable for being bonded with the upper metal layer 254 of the pads 252, wherein the upper metal layer 254 includes Au, Cu, Ni, Sn, SnPb alloy, or lead-free solder material, for example and could be formed using an electroplating process. The adhesion/barrier layer 253 includes one metal layer of TiW, Ti or Ni, or multiple metal layers stacked by a Cr layer and a Cu—Cr alloy layer, the Cu—Cr alloy layer formed on the Cr layer, for example. The adhesion/barrier layer 253 could be formed using a sputter or evaporating process. In a case, the pads 252 are deposited sequentially by sputtering a Ti layer on original copper or aluminum pads, sputtering a seed layer comprising copper on the Ti layer, electroplating a copper layer on the seed layer, electroplating a nickel layer on the copper layer, and electroplating a solder layer comprising SnPb alloy or a lead free soldering material on the nickel layer.

Next, a patterned polymer layer 260 serving as the underfill can be formed on the wafer 250. Multiple openings 262 are formed in the patterned polymer layer 260 and expose the pads 252 of the wafer 250. The patterned polymer layer 260 having a thickness ranging from about 5 µm to 400 µm and, preferably, ranging from about 10 µm to 100 µm. The bumps 240 have a height h greater than that of the patterned polymer layer 260. The difference between the height h of the bumps 240 and the thickness t of the patterned polymer layer 260 is less than 50 µm and, preferably, less than 10 µm. The openings 262 in the patterned polymer layer 260 have a greatest lateral dimension w ranging 10 µm to 500 µm and can accommodate the bumps 240.

Before the patterned polymer layer 260 is heated, it is a non-fluid and highly viscous material under normal temperature. Therefore, free spread of the patterned polymer layer 260 and pollution of the pads 252 can be avoided. The patterned polymer layer 260 has a viscosity, for example, greater than 90,000 cP (1 cP=10-2 g/cm*s) under normal temperature. The higher the temperature, the less viscous the patterned polymer layer 260 during heating period. The patterned polymer layer 260 includes epoxy resin, flux, and filler. Also, filler can be optionally saved. Alternatively, the patterned polymer layer 260 may include silicone, polyimide or benzocyclobutene (BCB).

In one mode, the patterned polymer layer 260 can be formed on the wafer 250 using a screen-printing process.

Alternatively, the patterned polymer layer 260 can be deposited by providing a patterned dry film containing the desired polymer and then heat laminating the patterned dry film onto the wafer 250.

Alternatively, the patterned polymer layer 260 can be deposited by first laminating a dry film containing the desired polymer onto the wafer 250 and then patterning the dry film. If a photosensitive material is used as the dry film, a photolithography method can be used to pattern the dry film. If a non-photosensitive material is used as the dry film, a photolithography and etching method can be applied to pattern the dry film.

Alternatively, the patterned polymer layer 260 can be deposited by first forming a polymer layer containing the desired polymer on the wafer 250 using a spin-on coating method, next curing the spin-on coated polymer layer and then patterning the cured polymer layer. If a photosensitive material is used as the cured polymer layer, a photolithography method can be used to pattern the cured polymer layer. If a non-photosensitive material is used as the cured polymer layer, a photolithography and etching method can be applied to pattern the cured polymer layer.

After forming the patterned polymer layer 260 serving as the underfill onto the wafer 250, the chips 210 can be mounted onto the wafer 250 and the bumps 240 are put in the openings 262 in the patterned polymer layer 260, as shown in FIG. 4. A thermal process, such as by baking, microwave, or infrared-ray, is then performed to joint the solder material 230 of the bumps 240 with the solder material of the pads 252, as shown in FIG. 5.

During the thermal process maintaining a temperature of between 80° C. and 400° C. for example, the bumps 240 can be joined to the pads 252 and the patterned polymer layer 260 can be cured. Due to the patterned polymer layer 260 having the less viscosity under the higher temperature, the patterned polymer layer 260 increases its fluidity as the temperature goes up such it can be filled up between the chips 210 and the wafer 250 and can cover the bumps 240. After the thermal process, the patterned polymer layer 260 will be cooled down and turn into solid without fluidity.

The patterned polymer layer 260 contains flux so that the contained flux will outflow from the patterned polymer layer 260 during the thermal process, which will be of benefit to the bonding of the bumps 240 and the pads 252, the bonding of bumps 240 and the patterned polymer layer 260 and the bonding of the patterned polymer layer 260 and surface 214 of chip 210.

Alternatively, when the bumps 240 have been joined to the pads but the patterned polymer layer 260 has not been solid yet, electricity detection can be performed. If the results of the electricity detection indicate normal condition, another thermal process will be performed to completely cure the patterned polymer layer 260. If the results of the electricity detection indicate abnormal condition, a repair procedure will be taken. Another thermal process will then be treated to completely cure the patterned polymer layer 260 if the results of the electricity detection indicate normal condition after the repair procedure is done.

After bonding the chips 210 onto the wafer 250 and curing the patterned polymer layer 260, the wafer 250 can be cut to be divided into multiple chip modules.

For all the above statements, the process takes the advantage of the highly viscous patterned polymer layer 260 serving as the underfill. When the patterned polymer layer 260 is formed on the wafer 250, free flow of the patterned polymer layer 260 on the wafer 250 will be prevented and therefore the patterned polymer layer 260 will not contaminate the pads 252 of the wafer 250. Moreover, the tolerance distance between the chip 210 and the pads of the wafer 250 adjacent to the chip 210 can be reduced, so layout design for the wafer 250 becomes much easy. The patterned polymer layer 260 as the underfill can be deposited on the wafer 250 using a screen printing process, laminating process or spin-on coating process. Compared with the traditional way of the underfill being filled into each gap between multiple chips and a wafer, it is much efficiency that the invention takes only one step, such as screen printing, laminating or spin-on coating, for forming the patterned polymer layer 260 as the underfill on the wafer 250.

Second Embodiment

Figure 6:
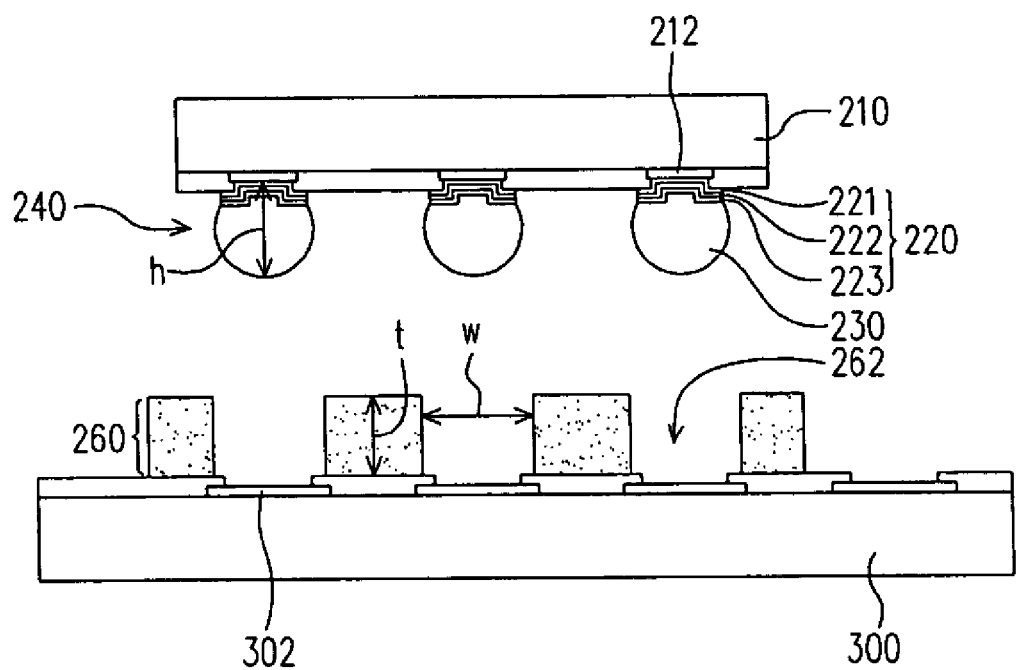
FIG. 6 is a cross-sectional view showing a chip bonding structure according to a second preferred embodiment.

The process mentioned above is applicable not only to forming an underfill between two chips but also to forming an underfill between a chip and a substrate, as shown in FIG. 6. FIG. 6 is a cross-sectional view showing the bonding of a chip and a substrate according to a second preferred embodiment.

At first, a number of bumps 240 are formed on the pads 212 of the chip 210. The bumps 240 herein may have the same structure or materials as the bumps 240 described in the first embodiment. Next, a patterned polymer layer 260 is formed on a substrate 300 such as printed circuit board. There are multiple openings 262 formed in the patterned polymer layer 260 and exposing multiple pads 302 of the substrate 300. The patterned polymer layer 260 may have a thickness between about 5 μm and 400 μm and, preferably, between about 10 μm and 100 μm. The structure of the patterned polymer layer 260 and the process for forming the same can be referred to the first embodiment.

Thereafter, multiple chips 210 are mounted on the substrate 300, the bumps 240 located in the openings 260 in the patterned polymer layer 260. Next, a thermal process is undergone to bond the bumps 240 and the pads 302 of the substrate 300. The thermal process and temperature regulating are given as described in the first embodiment. After bonding the chips 210 onto the substrate 300 and curing the patterned polymer layer 260, the substrate 300 can be cut to be divided into multiple chip modules.

Third Embodiment

Figure 7:
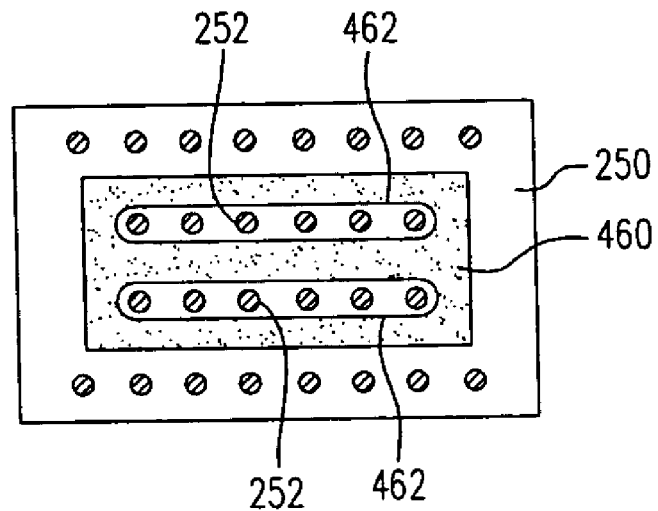
FIG. 7 is a top view showing a chip bonding structure according to a third preferred embodiment.

In the process for forming the underfill mentioned above, each of the openings in the patterned polymer layer exposes only one pad. However, the invention can not be limited to the above embodiments. As shown in FIG. 7, a top view showing an underfill formed on a wafer or a substrate according to a third preferred embodiment, multiple socket-shaped openings 462 are formed in the patterned polymer layer 460. Each of the socket-shaped openings 462 may expose multiple aligned pads 252 of the wafer 250. Alternatively, the openings in the patterned polymer layer may have various shapes. The structure of the patterned polymer layer 460 and the process for forming the same can be referred to the detail of the patterned polymer layer 260 described in the first embodiment. The only difference between the patterned polymer layers 260 and 460 is the shape of the openings 262 and 462.

The patterned polymer layer 460 described in the third preferred embodiment not only can serve as the underfill between two chips but also can serve the underfill between a chip and a substrate, that is, an opening in the patterned polymer layer formed on a substrate may expose multiple pads of the substrate.

Fourth Embodiment

Figure 8:
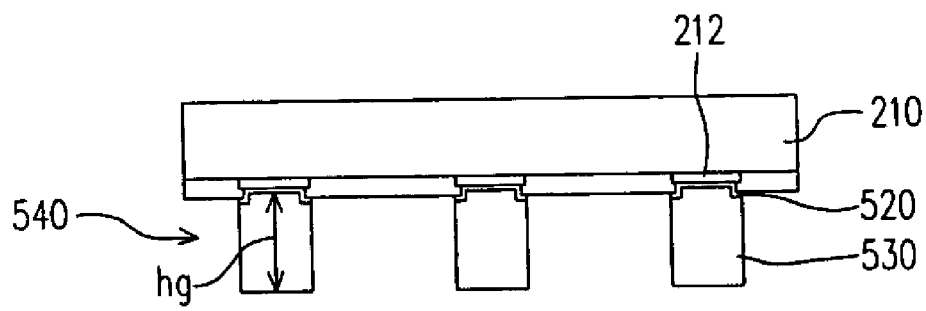
FIGS. 8 and 9 are cross-sectional views showing a chip bonding process according to a fourth preferred embodiment.
Figure 8:
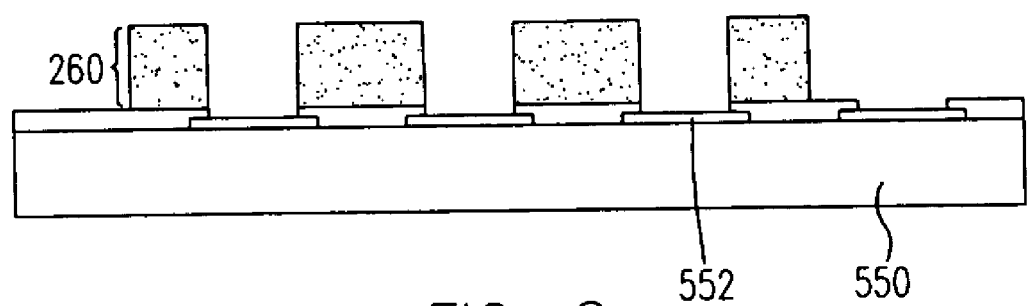
Figure 9:
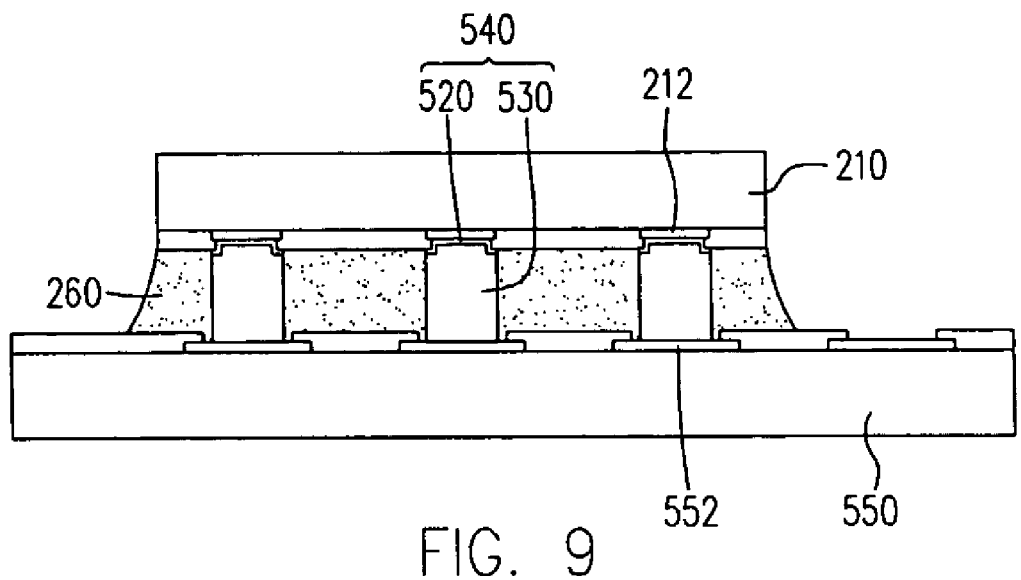

Alternatively, referring to FIG. 8, the bumps 540 formed on the chip 210 may comprise a gold layer 530 having a thickness hg between 5 μm and 200 μm and an adhesion/barrier layer 520 such as TiW, Ti, TaN or Ta, the adhesion/barrier layer 520 formed on multiple pad 212 of the chip 210 and the gold layer 530 formed on the adhesion/barrier layer 520. After forming the above-mentioned patterned polymer layer 260 on the wafer or substrate 550, the chips 210 can be mounted onto the wafer 250 or substrate 300 by bonding the gold layer 530 of the bumps 540 with a gold layer or an aluminum layer of multiple pads 552 of the wafer or substrate 550 using a heat pressing process, as shown in FIG. 9. The structure of the patterned polymer layer 260 and the process for forming the same can be referred to the first embodiment. During the heat pressing process, the patterned polymer layer 260 can be filled up between the chips 210 and the wafer or substrate 550 and can cover the bumps 540. Alternatively, the patterned polymer layer 260 can be filled up between the chips 210 and the wafer or substrate 550 and can cover the bumps 540 using another thermal process after taking the above-mentioned heat pressing process. Optionally, before the thermal process is performed, the above-mentioned electricity detecting or repair working can be taken.

Fifth Embodiment

Figure 10:
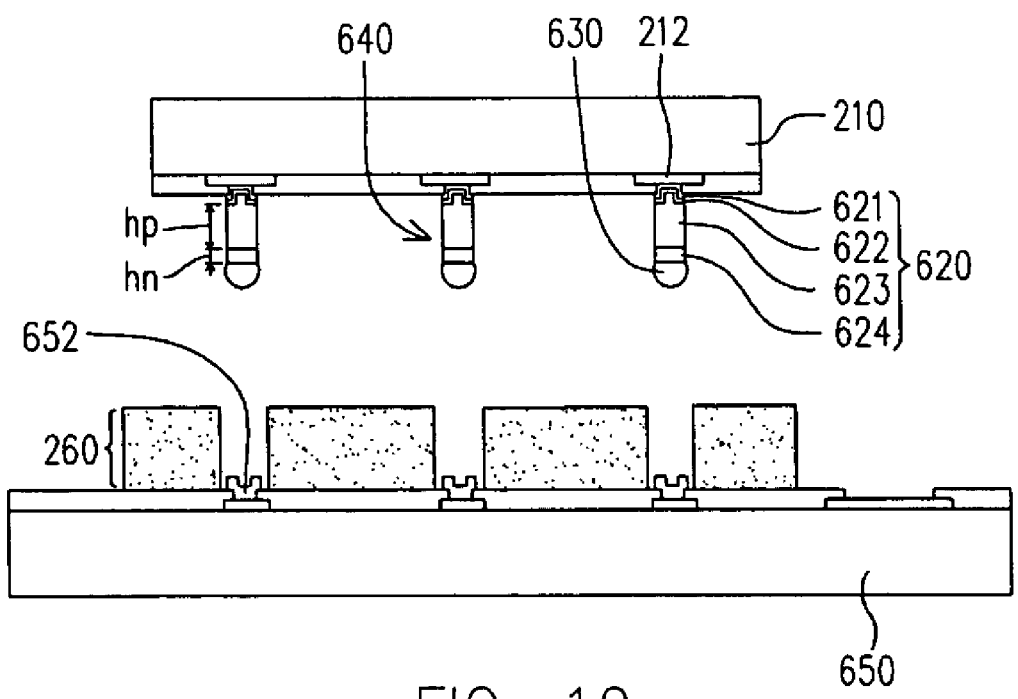
FIGS. 10 and 11 are cross-sectional views showing a chip bonding process according to a fifth preferred embodiment.
Figure 11:
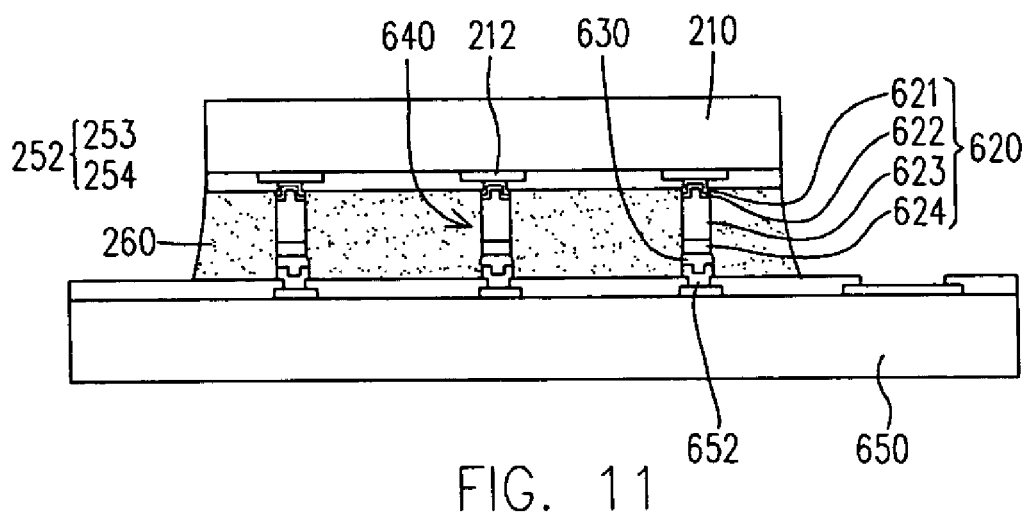

Alternatively, referring to FIG. 10, one or more bumps 640 formed on the chip may comprise a post structure 620 and a solder material 630. The post structure 620 can be deposited by sputtering an adhesion/barrier layer 621 on multiple original aluminum or copper pads 212 of the chip 210, sputtering a seed layer 622 comprising copper on the adhesion/barrier layer 621, electroplating a copper layer 623 having a thickness hp ranging from 10 μm to 150 μm on the seed layer 622 and then electroplating a nickel layer 624 having a thickness hn ranging from 1 μm to 20 μm on the copper layer 623. The adhesion/barrier layer 621 comprises one layer of Ti, TiN or titanium-tungsten alloy, or comprises multiple layers stacked by a Cr layer and a Cu—Cr-alloy layer, the Cu—Cr-alloy layer formed on the Cr layer. The solder material 630 can be formed on the nickel layer 623 of the post structure 620. The solder material 630 could be, for example, SnPb alloy, Sn—Ag alloy, Sn—Ag—Cu alloy or other lead-free solder material. The detail of the bumps 640 can be referred to U.S. Ser. Nos. 09/837,007, 10/638,454, 10/055,580, 10/874,704 and 10/174,357, all assigned to the common assignee, and herein incorporated by reference in their entirety. After forming the above-mentioned patterned polymer layer 260 on the wafer or substrate 650, the chips 210 can be mounted onto the wafer or substrate 650 by bonding the solder material 630 of the bumps 640 with multiple pads 652 of the wafer or substrate 650 using a reflow process. The pads 652 of the wafer or substrate 650 capable of being bonded with the solder material could have the same structure or could be formed by the same process as the pads 252 described in the first embodiment. The structure of the patterned polymer layer 260 and the process for forming the same can be referred to the first embodiment. During the reflow process, the patterned polymer layer 260 can be filled up between the chips 210 and the wafer or substrate 650 and can cover the bumps 640, as shown in FIG. 11. Alternatively, the patterned polymer layer 260 can be filled up between the chips 210 and the wafer or substrate 650 and can cover the bumps 640 using another thermal process after taking the above-mentioned reflow process. Optionally, before the thermal process is performed, the above-mentioned electricity detecting or repair working can be taken.

Conclusion

For all these statements, the invention has the following advantages.

1. The invented process takes the advantage of the highly viscous patterned polymer layer serving as the underfill. When the patterned polymer layer is formed on the wafer or substrate, free flow of the patterned polymer layer on the wafer or substrate will be prevented and therefore the patterned polymer layer will not contaminate the pads of the wafer or substrate. Moreover, the tolerance distance between the upper chip and the pads of the wafer or substrate adjacent to the upper chip can be reduced, so layout design for the wafer or substrate becomes much easy.

2. The patterned polymer layer as the underfill can be deposited on the wafer using a screen printing process, laminating process or spin-on coating process. Compared with the traditional way of the underfill being filled into each gap between multiple chips and a wafer or between multiple chips and a substrate, it is much efficiency that the invention takes only one step, such as screen printing, laminating or spin-on coating, for forming the patterned polymer layer as the underfill on the wafer or substrate.

It will be apparent to those skilled in the art that various modifications and variations can be made to the structure of the present invention without departing from the scope or spirit of the invention. For example, it is possible that the wire-bonding pad is not electrically connected to the testing pad or to the bump pad. In view of the foregoing, it is intended that the present invention cover modifications and variations of this invention provided they fall within the scope of the following claims and their equivalents.

What is claimed is:

1. A process of bonding a chip and a substrate, comprising:
    providing a metal bump on said chip, wherein said metal bump comprises a tin-containing portion over said chip;
    providing said substrate with a gold-containing layer;
    after said providing said substrate with said gold-containing layer, forming a polymer layer with a thickness between 5 μm and 400 μm on said substrate, wherein said metal bump has a height greater than said thickness of said polymer layer, wherein a difference between said height of said metal bump and said thickness of said polymer layer is less than 50 μm;
    after said forming said polymer layer, directly physically joining said tin-containing portion and said gold-containing layer at a temperature between 80° C. and 400° C., directly physically joining said polymer layer and said metal bump and directly physically joining said polymer layer and said chip; and
    after said directly physically joining said tin-containing portion and said gold-containing layer, cutting said substrate.

2. The process of claim 1 further comprising said providing said metal bump on said chip having multiple active devices, and said providing said substrate with multiple active devices.

3. The process of claim 1 further comprising said forming said polymer layer with polyimide.

4. The process of claim 1, wherein said forming said polymer layer comprises a screen printing process.

5. The process of claim 1 further comprising said forming said polymer layer with said thickness between 10 μm and 100 μm.

6. The process of claim 1 further comprising said forming said polymer layer with a filler.

7. The process of claim 1, further comprising said providing said metal bump with a copper layer under said tin-containing portion.

8. The process of claim 1, wherein said forming said polymer layer comprises laminating a dry film on said substrate.

9. The process of claim 1, wherein said forming said polymer layer comprises a spin-on coating process.

10. The process of claim 1 further comprising said forming said polymer layer with said difference less than 10 μm.

11. The process of claim 1 further comprising said directly physically joining said tin-containing portion and said gold-containing layer that is exposed by an opening in said polymer layer.

12. The process of claim 1 further comprising said forming said polymer layer that is non-fluid before said directly physically joining said tin-containing portion and said gold-containing layer, said directly physically joining said polymer layer and said metal bump, and said directly physically joining said polymer layer and said chip.

13. The process of claim 1 further comprising said forming said polymer layer that has a viscosity greater than 90,000 cP before said directly physically joining said tin-containing portion and said gold-containing layer, said directly physically joining said polymer layer and said metal bump, and said directly physically joining said polymer layer and said chip.

14. A process of bonding a chip and a substrate, comprising:
    providing a metal bump on said chip, wherein said metal bump comprises a first titanium-containing layer over said chip;
    providing said substrate with a gold-containing layer;
    after said providing said substrate with said gold-containing layer, forming a polymer layer with a thickness between 5 μm and 400 μm on said substrate, wherein said metal bump has a height greater than said thickness of said polymer layer, wherein a difference between said height of said metal bump and said thickness of said polymer layer is less than 10 μm;
    after said forming said polymer layer, directly physically joining said metal bump and said gold-containing layer at a temperature between 80° C. and 400° C., directly physically joining said polymer layer and said metal bump, and directly physically joining said polymer layer and said chip; and
    after said directly physically joining said metal bump and said gold-containing layer, cutting said substrate.

15. The process of claim 14, wherein said forming said polymer layer comprises laminating a dry film on said substrate.

16. The process of claim 14, wherein said forming said polymer layer comprises a spin-on coating process.

17. The process of claim 14 further comprising said providing said metal bump on said chip having multiple active devices, and said providing said substrate with multiple active devices.

18. The process of claim 14 further comprising said providing said substrate with a second titanium-containing layer under said gold-containing layer, wherein said gold-containing layer is directly on said second titanium-containing layer.

19. The process of claim 14 further comprising said providing said substrate with a nickel-containing layer under said gold-containing layer, wherein said gold-containing layer is directly on said nickel-containing layer.

20. The process of claim 14 further comprising said forming said polymer layer with said thickness between 10 μm and 100 μm.

21. The process of claim 14 further comprising said forming said polymer layer with polyimide.

22. The process of claim 14 further comprising said forming said polymer layer with a filler.

23. The process of claim 14 further comprising said directly physically joining said metal bump and said gold-containing layer that is exposed by an opening in said polymer layer.

24. The process of claim 14 further comprising said forming said polymer layer that is non-fluid before said directly physically joining said metal bump and said gold-containing layer, said directly physically joining said polymer layer and said metal bump, and said directly physically joining said polymer layer and said chip.

25. The process of claim 14 further comprising said forming said polymer layer that has a viscosity greater than 90,000 cP before said directly physically joining said metal bump and said gold-containing layer, said directly physically joining said polymer layer and said metal bump, and said directly physically joining said polymer layer and said chip.

26. A process of bonding a chip and a substrate, comprising:
providing a metal bump on said chip, wherein said metal bump comprises a copper layer with a thickness between 10 µm and 150 µm over said chip, and a tin-containing portion over said copper layer;
providing said substrate with a first metal pad;
after said providing said substrate with said first metal pad, forming a polymer layer on said substrate, wherein said metal bump has a height greater than a thickness of said polymer layer; and
after said forming said polymer layer, directly physically joining said tin-containing portion and said first metal pad, directly physically joining said polymer layer and said metal bump, and directly physically joining said polymer layer and said chip.

27. The process of claim 26 further comprising said providing said metal bump on said chip having multiple active devices, and said providing said substrate with multiple active devices.

28. The process of claim 26 further comprising said providing said metal bump with a titanium-containing layer under said copper layer.

29. The process of claim 26 further comprising said forming said polymer layer with said thickness between 10 µm and 100 µm.

30. The process of claim 26 further comprising said forming said polymer layer with a filler.

31. The process of claim 26, wherein said forming said polymer layer comprises a spin-on coating process.

32. The process of claim 26 further comprising said directly physically joining said tin-containing portion and a gold-containing layer of said first metal pad.

33. The process of claim 26 further comprising said providing said metal bump with a nickel-containing layer between said copper layer and said tin-containing portion.

34. The process of claim 26 further comprising said directly physically joining said tin-containing portion and said first metal pad that is exposed by an opening in said polymer layer.

35. The process of claim 26 further comprising said directly physically joining said tin-containing portion and said first metal pad that is exposed by an opening in said polymer layer, said opening further exposing a second metal pad of said substrate.

36. The process of claim 26 further comprising said forming said polymer layer that is non-fluid before said directly physically joining said tin-containing portion and said first metal pad, said directly physically joining said polymer layer and said metal bump, and said directly physically joining said polymer layer and said chip.

37. The process of claim 26 further comprising said forming said polymer layer that has a viscosity greater than 90,000 cP before said directly physically joining said tin-containing portion and said first metal pad, said directly physically joining said polymer layer and said metal bump, and said directly physically joining said polymer layer and said chip.

38. The process of claim 26 further comprising said forming said polymer layer with a thickness between 5 µm and 400 µm.

39. The process of claim 26 further comprising said directly physically joining said tin-containing portion and a tin-containing layer of said first metal pad.

40. The process of claim 26 further comprising said providing said substrate with said first metal pad comprising copper.

41. The process of claim 26 further comprising said providing said substrate with said first metal pad comprising nickel.

42. A process of bonding a chip and a substrate, comprising:
providing a metal bump on said chip, wherein said metal bump comprises a first gold layer over said chip;
providing said substrate with a second gold layer;
after said providing said substrate with said second gold layer, forming a polymer layer with a thickness between 5 µm and 400 µm on said substrate, wherein said metal bump has a height greater than said thickness of said polymer layer; and
after said forming said polymer layer, directly physically joining said first gold layer and said second gold layer, directly physically joining said polymer layer and said metal bump, and directly physically joining said polymer layer and said chip.

43. The process of claim 42 further comprising said providing said metal bump with said first gold layer having a thickness between 5 µm and 200 µm.

44. The process of claim 42 further comprising said forming said polymer layer with polyimide.

45. The process of claim 42 further comprising said forming said polymer layer with said thickness between 10 µm and 100 µm.

46. The process of claim 42 further comprising said forming said polymer layer with a filler.

47. The process of claim 42, wherein said forming said polymer layer comprises a spin-on coating process.

48. The process of claim 42 further comprising said directly physically joining said first gold layer and said second gold layer that is exposed by an opening in said polymer layer.

49. The process of claim 42 further comprising said forming said polymer layer that is non-fluid before said directly physically joining said first gold layer and said second gold layer, said directly physically joining said polymer layer and said metal bump, and said directly physically joining said polymer layer and said chip.

50. The process of claim 42 further comprising said forming said polymer layer that has a viscosity greater than 90,000 cP before said directly physically joining said first gold layer and said second gold layer, said directly physically joining said polymer layer and said metal bump, and said directly physically joining said polymer layer and said chip.

51. A process of bonding a chip and a substrate, comprising:
providing a metal bump on said chip, wherein said metal bump comprises a copper layer over said chip, and a tin-containing portion over said copper layer, wherein said copper layer has a width and a thickness greater than said width;
providing said substrate with a first metal pad;
after said providing said substrate with said first metal pad, forming a polymer layer on said substrate, wherein said metal bump has a height greater than a thickness of said polymer layer; and after said forming said polymer layer, directly physically joining said tin-containing portion and said first metal pad, directly physically joining said polymer layer and said metal bump, and directly physically joining said polymer layer and said chip.

52. The process of claim 51 further comprising said providing said metal bump on said chip having multiple active devices, and said providing said substrate with multiple active devices.

53. The process of claim 51 further comprising said providing said metal bump with a titanium-containing layer under said copper layer.

54. The process of claim 51 further comprising said forming said polymer layer with said thickness between 10 μm and 100 μm.

55. The process of claim 51 further comprising said forming said polymer layer with a filler.

56. The process of claim 51, wherein said forming said polymer layer comprises a spin-on coating process.

57. The process of claim 51 further comprising said directly physically joining said tin-containing portion and a gold-containing layer of said first metal pad.

58. The process of claim 51 further comprising said providing said metal bump with a nickel-containing layer between said copper layer and said tin-containing portion.

59. The process of claim 51 further comprising said forming said polymer layer with said thickness between 5 μm and 400 μm.

60. The process of claim 51 further comprising said providing said metal bump with said copper layer having said thickness between 5 μm and 400 μm.

61. The process of claim 51 further comprising said directly physically joining said tin-containing portion and said first metal pad that is exposed by an opening in said polymer layer.

62. The process of claim 51 further comprising said directly physically joining said tin-containing portion and said first metal pad that is exposed by an opening in said polymer layer, said opening further exposing a second metal pad of said substrate.

63. The process of claim 51 further comprising said forming said polymer layer that is non-fluid before said directly physically joining said metal bump and said gold-containing layer, said directly physically joining said polymer layer and said metal bump, and said directly physically joining said polymer layer and said chip.

64. The process of claim 51 further comprising said forming said polymer layer that has a viscosity greater than 90,000 cP before said directly physically joining said metal bump and said gold-containing layer, said directly physically joining said polymer layer and said metal bump, and said directly physically joining said polymer layer and said chip.

65. The process of claim 51 further comprising said directly physically joining said tin-containing portion and a tin-containing layer of said first metal pad.

66. The process of claim 51 further comprising said providing said substrate with said first metal pad comprising copper.

67. The process of claim 51 further comprising said providing said substrate with said first metal pad comprising nickel.

\* \* \* \* \*